(12) United States Patent
Meng et al.

(10) Patent No.: US 12,520,600 B1
(45) Date of Patent: Jan. 6, 2026

(54) SILICON-BASED HETEROJUNCTION SOLAR CELL AND MANUFACTURING METHOD THEREOF

(71) Applicant: Trina Solar Co., Ltd., Jiangsu (CN)

(72) Inventors: Zibo Meng, Jiangsu (CN); Hongwei Li, Jiangsu (CN); Yongheng Wang, Jiangsu (CN); Cong Guo, Jiangsu (CN); Guangtao Yang, Jiangsu (CN)

(73) Assignee: Trina Solar Co., Ltd., Changzhou (CN)

( * ) Notice: Subject to any disclaimer, the term of this patent is extended or adjusted under 35 U.S.C. 154(b) by 0 days.

(21) Appl. No.: 18/819,836

(22) Filed: Aug. 29, 2024

(30) Foreign Application Priority Data

Jul. 5, 2024 (CN) .......................... 202410896155.1

(51) Int. Cl.
*H10F 10/166* (2025.01)
*H10F 71/10* (2025.01)
*H10F 77/1223* (2025.01)
*H10F 77/166* (2025.01)
*H10F 77/30* (2025.01)

(52) U.S. Cl.
CPC ........... *H10F 10/166* (2025.01); *H10F 71/10* (2025.01); *H10F 71/1035* (2025.01); *H10F 77/1223* (2025.01); *H10F 77/1665* (2025.01); *H10F 77/311* (2025.01)

(58) Field of Classification Search
None
See application file for complete search history.

(56) References Cited

U.S. PATENT DOCUMENTS

2022/0238748 A1    7/2022   Chen et al.

FOREIGN PATENT DOCUMENTS

| CN | 111628032 A | 9/2020 |
|----|-------------|--------|
| CN | 112002778 A | 11/2020 |
| CN | 113113502 A | 7/2021 |
| CN | 215220730 U | 12/2021 |
| CN | 116995111 A | 11/2023 |
| CN | 117525196 A | 2/2024 |
| CN | 118248762 A | 6/2024 |
| JP | H0823114 A  | 1/1996 |

OTHER PUBLICATIONS

Notification of First Office Action dated Aug. 7, 2024, for Chinese Application No. 202410896155.1.
Notification to Grant Patent Right for Invention dated Sep. 18, 2024, for Chinese Application No. 202410896155.1.

*Primary Examiner* — Eli S Mekhlin
(74) *Attorney, Agent, or Firm* — Renner, Otto, Boisselle & Sklar, LLP

(57) ABSTRACT

The present application provides a silicon-based heterojunction solar cell and a manufacturing method thereof. The silicon-based heterojunction solar cell includes: a silicon substrate, as well as a first passivation layer, an N-type doped layer, a first transparent conductive oxide layer and a first electrode. The first passivation layer, the N-type doped layer, the first transparent conductive oxide layer and the first electrode are sequentially stacked on the front side of the silicon substrate along a first direction. The first passivation layer includes a first sub-passivation layer, a carbon-doped amorphous silicon layer and a second sub-passivation layer which are sequentially stacked along the first direction.

18 Claims, 2 Drawing Sheets

SILICON-BASED HETEROJUNCTION SOLAR CELL AND MANUFACTURING METHOD THEREOF

CROSS-REFERENCE TO RELATED APPLICATIONS

This application claims the priority of Chinese Patent Application No. 202410896155.1, submitted to the Chinese Intellectual Property Office on Jul. 5, 2024, the application of which is incorporated herein in its entirety by reference.

TECHNICAL FIELD

The present application belongs to the technical field of solar cells and relates to a silicon-based heterojunction solar cell and a manufacturing method thereof.

BACKGROUND

A silicon-based heterojunction cell (Heterojunction with Intrinsic Thin layer, HJT) is a high-efficiency solar cell, which has such technical advantages as excellent low-light response, high cell efficiency, fewer production processes, high double-sided rate, and so on.

In the current battery structure, intrinsic amorphous silicon is usually taken as a passivation material on the surface of a crystalline silicon. Because the conductivity of the intrinsic amorphous silicon is poor, a certain thickness is needed to maintain good passivation, which requires a trade-off in the process. In addition, in order to achieve better ohmic contact between the N-doped layer and the transparent conductive oxide (TCO) layer, it is necessary to increase the doping concentration of the contact layer to enhance the transport performance of the carriers. However, an increase in the doping concentration will correspondingly increase the parasitic absorption, which will result in the current loss in the solar cell.

SUMMARY

Embodiments of the present application provide a silicon-based heterojunction solar cell and a manufacturing method thereof, so as to solve or alleviate the above-mentioned technical problems. According to the silicon-based heterojunction solar cell provided by the embodiments of the present application, the first passivation layer (namely the N-type passivation layer) includes the carbon-doped amorphous silicon layer, which is beneficial to optimize the conductivity of the film layer, thereby improving the short-circuit current and fill factor of the cell and improving the performance of the device.

A first aspect of the embodiments of the present application provides a silicon-based heterojunction solar cell. The silicon-based heterojunction solar cell includes:
  a silicon substrate including a front side and a back side, the front side being arranged opposite to the back side;
  a first passivation layer, an N-type doped layer, a first transparent conductive oxide layer and a first electrode, which are sequentially stacked on the front side of the silicon substrate along a first direction; where
  the first passivation layer includes a first sub-passivation layer, a carbon-doped amorphous silicon layer and a second sub-passivation layer which are sequentially stacked along the first direction;
  the carbon-doped amorphous silicon layer is arranged between the first sub-passivation layer and the second sub-passivation layer, which is beneficial for an electronic band transition based on a defect density of carbon-doped amorphous silicon, thereby improving a conductivity of the first passivation layer.

A second aspect of the embodiments of the present application provides a method for manufacturing a silicon-based heterojunction solar cell. The method for manufacturing a silicon-based heterojunction solar cell includes:
  providing a silicon substrate, where the silicon substrate includes a front side and a back side, and the front side is arranged opposite to the back side;
  sequentially forming, on the front side of the silicon substrate, a first sub-passivation layer, a carbon-doped amorphous silicon layer and a second sub-passivation layer; where the first sub-passivation layer, the carbon-doped amorphous silicon layer and the second sub-passivation layer jointly constitute a first passivation layer;
  forming an N-type doped layer on the second sub-passivation layer;
  forming a first transparent conductive oxide layer on the N-type doped layer;
  forming a first electrode on the first transparent conductive oxide layer.

The technical scheme of the present application has the following beneficial effects.

A first passivation layer is on the front side of the silicon substrate, and the first passivation layer includes a first sub-passivation layer, a carbon-doped amorphous silicon layer, and a second sub-passivation layer which are sequentially stacked. The first sub-passivation layer, which is close to the silicon substrate, possesses the excellent passivation effect; and the second sub-passivation layer, which is far away from the silicon substrate, is conducive to the formation of the subsequent doped layer. The carbon-doped amorphous silicon layer, located between the first sub-passivation layer and the second sub-passivation layer, is an amorphous structure formed by silicon carbide ($Si_xC_y$, x is not equal to y), which is beneficial to optimize the conductivity of the film layer, thereby reducing the thickness of the first passivation layer, and avoiding the issues such as the increase of resistance and the decrease of fill factor caused by excessively thick intrinsic amorphous silicon layer. In addition, the silicon carbide has a wider bandgap between the valence band and the conduction band, and the bandgap is 2.8-4.2 eV, which can improve the short-circuit current and fill factor of silicon-based heterojunction solar cells, thereby enhancing the performance of the device.

BRIEF DESCRIPTION OF THE DRAWINGS

In the drawings, the same reference numerals indicate the same or similar components or elements unless otherwise specified. The accompanying drawings are not limited by scale. The drawings are not necessarily to scale. It is appreciated that these drawings are only illustrative of some embodiments and do not constitute a limitation on the embodiments according to the present application.

Figure 1:
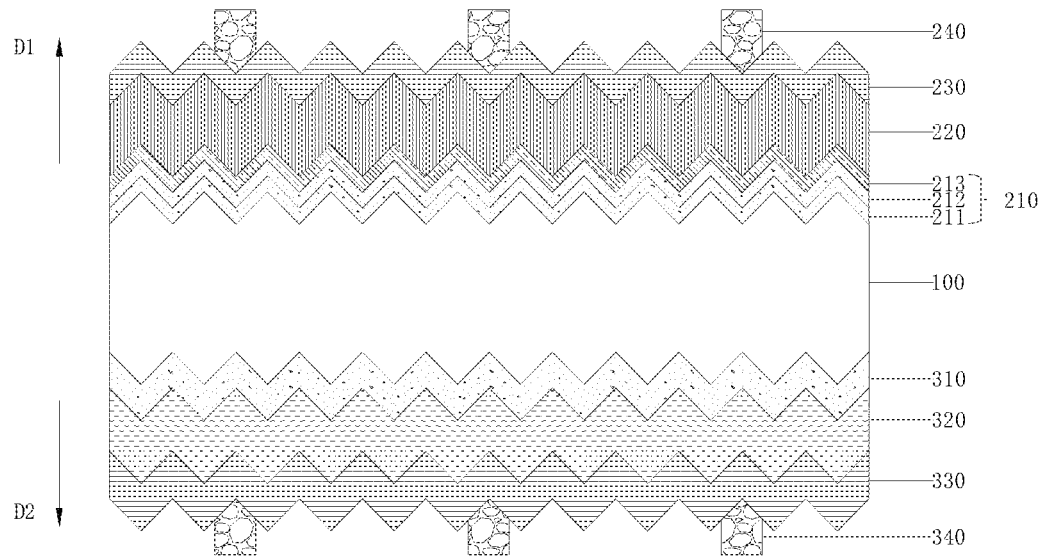
FIG. 1 is a schematic structural diagram of a silicon-based heterojunction solar cell according to Embodiment 1 of the present application.

REFERENCE NUMERAL 100, silicon substrate;
210, first passivation layer; 211, first sub-passivation layer; 212, carbon-doped amorphous silicon layer; 213, second sub-passivation layer; 220, N-type doped layer; 221, first oxygen-containing seed layer; 222, second oxygen-containing seed layer; 223, N-type doped host layer; 224, N-type doped contact layer; 230, first transparent conductive oxide layer; 240, first electrode; 250, pre-passivation layer;
310, second passivation layer; 311, third intrinsic amorphous silicon layer; 312, fourth intrinsic amorphous silicon layer; 313, fifth intrinsic amorphous silicon layer; 320, P-type doped layer; 321, P-type doped seed layer; 322, P-type doped host layer; 323, P-type doped contact layer; 330, second transparent conductive oxide layer; 340, second electrode;
D1, first direction; D2, second direction.

DETAILED DESCRIPTION

The technical solutions in the embodiments of the present application are described clearly and completely referring to the accompanying drawings of the present application. In the drawings, the size of layers, regions, elements, and the relative size may be exaggerated for clarity. In the accompanying drawings, the same reference numerals indicate the same or similar components or elements. The embodiments described below with reference to the accompanying drawings are illustrative only for the purpose of explaining the present application and should not be construed as a limiting on the scope of the present application. It should be noted that the embodiments and features of the embodiments of the present application may be combined with each other without conflict.

Referring to FIG. 1 to FIG. 4, an embodiment of the present application provides a silicon-based heterojunction solar cell, and the silicon-based heterojunction solar cell includes:
a silicon substrate 100, the silicon substrate 100 includes a front side and a back side which are arranged opposite to each other;
a first passivation layer 210, an N-type doped layer 220, a first transparent conductive oxide layer 230, and a first electrode 240, which are sequentially stacked on the front side of the silicon substrate 100 along a first direction D1; where
the first passivation layer 210 includes: a first sub-passivation layer 211, a carbon-doped amorphous silicon layer 212 and a second sub-passivation layer 213, which are sequentially stacked along a first direction D1; and
the carbon-doped amorphous silicon layer is arranged between the first sub-passivation layer and the second sub-passivation layer, which is beneficial for the electronic band transition based on a defect density of the carbon-doped amorphous silicon, thereby improving the conductivity of the first passivation layer.

In the embodiment of the present application, a first passivation layer 210 is on the front side of the silicon substrate 100, and the first passivation layer 210 includes a first sub-passivation layer 211, a carbon-doped amorphous silicon layer 212, and a second sub-passivation layer 213, which are sequentially stacked. The first sub-passivation layer 211, which is close to the silicon substrate 100, possesses the excellent passivation effect; and the second sub-passivation layer 213, which is far away from the silicon substrate 100, is conducive to the formation of the subsequent doped layer. The carbon-doped amorphous silicon layer 212, located between the first sub-passivation layer 211 and the second sub-passivation layer 213, is an amorphous structure formed by silicon carbide ($Si_xC_y$, x is not equal to y), so that the carbon-doped amorphous silicon layer 212 has a high defect density. It is beneficial for the electronic band transition based on the high defect density of the carbon-doped amorphous silicon, thereby optimizing the conductivity of a film layer, reducing the thickness of the first passivation layer 210, and avoiding the issues such as the increase of resistance and the decrease of fill factor caused by excessively thick intrinsic amorphous silicon layer. In addition, the silicon carbide has a wider bandgap between the valence band and the conduction band, and the bandgap is 2.8-4.2 eV, which can improve the short-circuit current and fill factor of silicon-based heterojunction solar cells, thereby enhancing the performance of the device.

The silicon substrate 100 may be an N-type silicon substrate or a P-type silicon substrate. The N-type silicon substrate may be an N-type monocrystalline silicon substrate (for example, the crystalline phase is <100> or <111>), and the P-type silicon substrate may be a P-type monocrystalline silicon substrate (for example, the crystalline phase is <100> or <111>).

The present application will describe the structure of each layer of the silicon-based heterojunction solar cell and its cooperation relationship with other layers as follows.

In some embodiments, the structural factor of the first sub-passivation layer is greater than that of the carbon-doped amorphous silicon layer, and the structural factor of the carbon-doped amorphous silicon layer is greater than that of the second sub-passivation layer.

It should be noted that the compactness of each layer of the silicon-based heterojunction solar cell can be represented by the structural factor. The higher the compactness, the lower the structural factor; and the lower the compactness, the higher the structural factor. In the present application, the formula for calculating the structural factor (R*) is: $R^*=I_{(SiH_2)}/(I_{(SiH)}+I_{(SiH_2)})$, where $I_{(SiH)}$ represents the integral intensity of the stretching vibration mode Gaussian peaks of SiH at 2000 cm$^{-1}$, and $I_{(SiH_2)}$ represents the integral intensity of the stretching vibration mode Gaussian peaks of SiH$_2$ at 2090 cm$^{-1}$. The structural factor is related to the microvoids in the film and is used to characterize the compactness of the film.

In some embodiments, in the first passivation layer, the structure factors of the sub-layers sequentially stacked along the first direction decrease sequentially, that is, the compactness increases sequentially. The first sub-passivation layer close to the silicon substrate has a higher structural factor, therefore the first sub-passivation layer has a lower compactness, a higher refractive index, and a better passivation performance. The second sub-passivation layer close to the N-type doped layer has a lower structural factor, therefore the second sub-passivation layer has a higher compactness, a lower refractive index, and the conductivity of the solar cell is improved. The structural factor of the carbon-doped amorphous silicon layer is intermediate, and the photoelectric conversion performance of the solar cell can be improved on the premise of ensuring passivation. If the structural factor of the carbon-doped amorphous silicon layer is too high, the compactness is too low, the defect degree in the carbon-doped amorphous silicon layer is higher, and the conductivity is poor; if the structural factor of the carbon-doped amorphous silicon layer is too low, the compactness is too high, which can lead to the formation of the $Si_xC_y$ (x=y) structure, thereby being not beneficial for the conduction.

In some embodiments, the structural factor of the first sub-passivation layer is 0.6-0.75, the structural factor of the carbon-doped amorphous silicon layer is 0.45-0.58, and the structural factor of the second sub-passivation layer is 0.3-0.43. For example, the structural factor of the first sub-passivation layer may be 0.6, 0.63, 0.65, 0.68, 0.7, or 0.75, the structural factor of the carbon-doped amorphous silicon layer may be 0.45, 0.47, 0.5, 0.52, 0.55, or 0.58, and the structural factor of the second sub-passivation layer may be 0.3, 0.35, 0.38, 0.4, or 0.43.

In some embodiments, the carbon content of the carbon-doped amorphous silicon layer is 0.1-4.4 atomic percent (at %).

If the carbon content of the amorphous silicon layer is 0 at % or less than 0.1 at %, the conductivity of the amorphous silicon layer is lower. If the carbon content of the amorphous silicon layer is greater than 4.4 at %, it will lead to the decrease of the light transmittance of the film. When the carbon content of the amorphous silicon layer is 0.1-4.4 at %, the carbon-doped amorphous silicon layer not only has high conductivity to reduce resistance, but also has satisfied light transmittance. In some embodiments, the carbon content of the carbon-doped amorphous silicon layer is 3-4.4 at %. In some embodiments, the carbon content in the carbon-doped amorphous silicon layer may be 3 at %, 3.2 at %, 3.5 at %, 3.6 at %, 3.8 at %, 4 at %, 4.2 at %, or 4.4 at %.

In some embodiments, the thickness ratio of the first sub-passivation layer, the carbon-doped amorphous silicon layer, and the second sub-passivation layer is 1: (1-4):(5-7). For example, the thickness ratio of the first sub-passivation layer, the carbon-doped amorphous silicon layer, and the second sub-passivation layer may be 1:1:5, 1:1:6, 1:1:7, 1:2:5, 1:2:6, 1:2:7, 1:3:5, 1:3:6, 1:3:7, 1:4:5, 1:4:6, or 1:4:7.

In some embodiments, the first sub-passivation layer is a first oxygen-doped amorphous silicon layer or a first intrinsic amorphous silicon layer, and the silicon-oxygen ratio of the first oxygen-doped amorphous silicon layer is greater than 0.1 and less than 1. For example, the silicon-oxygen ratio of the first oxygen-doped amorphous silicon layer may be 0.15, 0.2, 0.3, 0.4, 0.5, 0.6, 0.7, 0.8, 0.9, or 0.95.

In some embodiments, the second sub-passivation layer is a second oxygen-doped amorphous silicon layer or a second intrinsic amorphous silicon layer, and the silicon-oxygen ratio of the second oxygen-doped amorphous silicon layer is greater than 0.1 and less than 1. For example, the silicon-oxygen ratio of the second oxygen-doped amorphous silicon layer may be 0.15, 0.2, 0.3, 0.4, 0.5, 0.6, 0.7, 0.8, 0.9, or 0.95.

In some embodiments, the thickness of the first sub-passivation layer is 0.5-2 nm, the thickness of the carbon-doped amorphous silicon layer is 0.5-2 nm, and the thickness of the second sub-passivation layer is 3-6 nm. For example, the thickness of the first sub-passivation layer may be 0.5 nm, 0.8 nm, or 1 nm, the thickness of the carbon-doped amorphous silicon layer may be 0.5 nm, 0.8 nm, or 1 nm, and the thickness of the second sub-passivation layer may be 3 nm, 4 nm, 4.5 nm, 5 nm, 5.5 nm, or 6 nm.

In some embodiments, the thickness of the first passivation layer is 5-8 nm. For example, the thickness of the first passivation layer may be 5 nm, 6 nm, 7 nm, or 8 nm.

Figure 2:
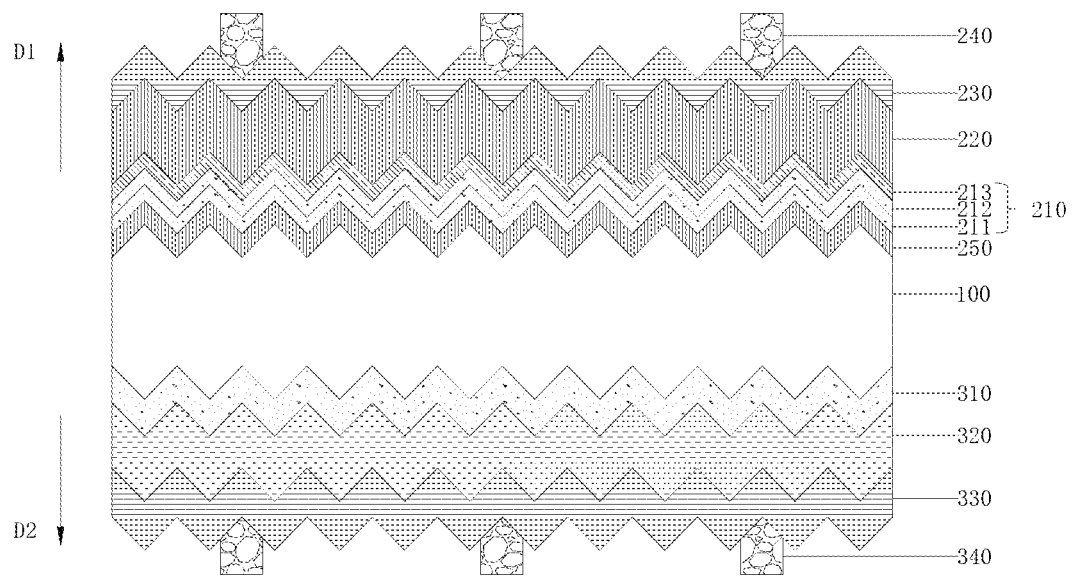
FIG. 2 is a schematic structural diagram of a silicon-based heterojunction solar cell according to Embodiment 5 of the present application.
Figure 4:
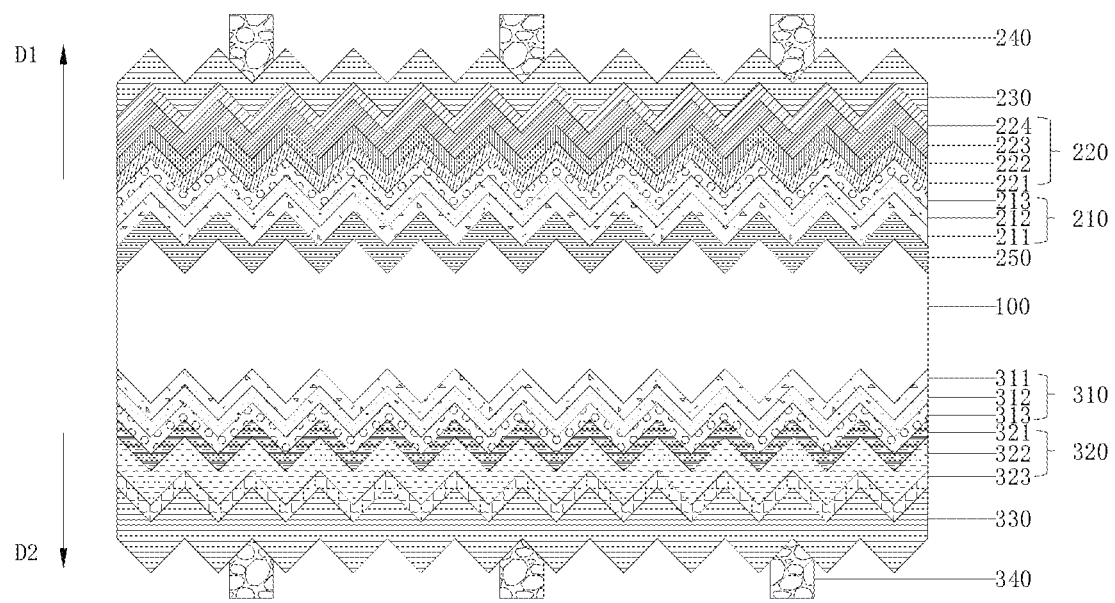
FIG. 4 is a schematic structural diagram of a silicon-based heterojunction solar cell according to Embodiment 10 of the present application.

In some embodiments, referring to FIG. 2 and FIG. 4, the silicon-based heterojunction solar cell further includes: a pre-passivation layer 250 being arranged between the silicon substrate 100 and the first passivation layer 210;
where the material of the pre-passivation layer 250 includes silicon oxide;
the pre-passivation layer 250 is formed by successively employing a slow-lifting process in hot water and a plasma-etching process.

In the embodiment of the present application, the pre-passivation layer 250 is located on the surface of the silicon substrate 100, so that the influence of the external environment (such as water vapor) on the silicon substrate 100 can be reduced. In addition, when the material of the pre-passivation layer 250 includes silicon oxide, the quality of the interface between the silicon substrate 100 and the first passivation layer 210 can be improved, defects and stress at the interface can be reduced, which can improve the passivation effect, thereby reducing the thickness of the first passivation layer 210 and ensuring the excellent fill factor of the device.

In some embodiments, the thickness of the pre-passivation layer is 0.01-0.03 nm (for example, 0.01 nm, 0.02 nm, or 0.03 nm). Such pre-passivation layer can sufficiently reduce defects and stress at the interface, thereby improving the passivation effect. And the fewer voids in the thinner pre-passivation layer can reduce the amount of adsorbed gas.

Figure 3:
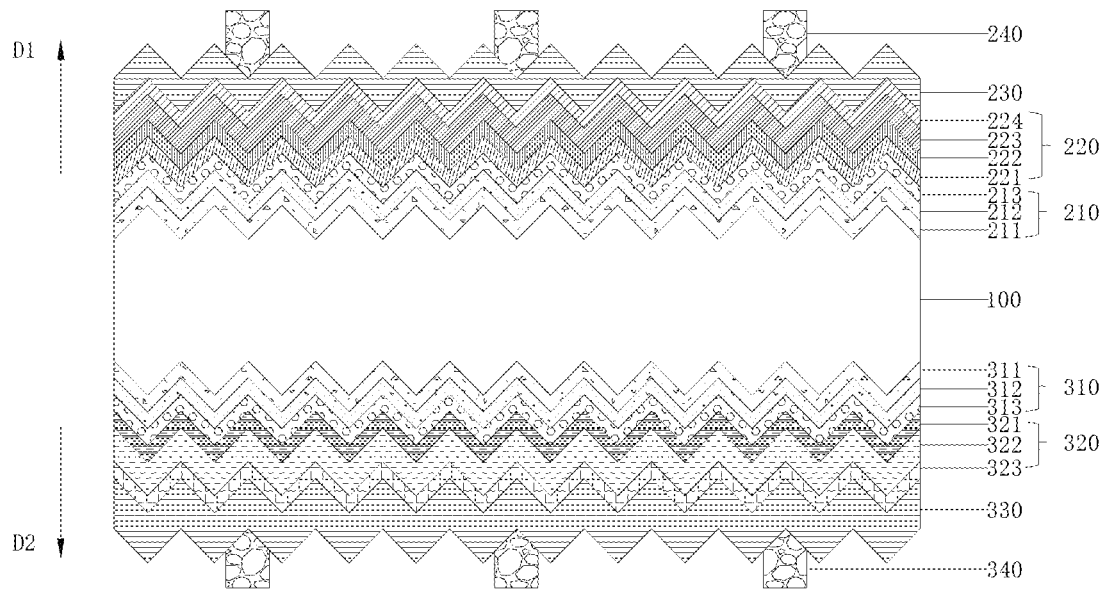
FIG. 3 is a schematic structural diagram of a silicon-based heterojunction solar cell according to Embodiment 6 of the present application.

In some embodiments, referring to FIG. 3 and FIG. 4, the N-doped layer 220 includes a first oxygen-containing seed layer 221, a second oxygen-containing seed layer 222, an N-type doped host layer 223, and an N-type doped contact layer 224, which are sequentially stacked along a first direction D1.

In these embodiments, the silicon-oxygen ratio of the first oxygen-containing seed layer is greater than or equal to 0.05 and less than 0.4, the silicon-oxygen ratio of the second oxygen-containing seed layer is greater than or equal to 0.4 and less than 0.7, and the silicon-oxygen ratio of the N-type doped host layer is greater than or equal to 0.6 and less than 1; and/or the phosphorus-silicon ratio of the first oxygen-containing seed layer is greater than or equal to 0.01 and less than 0.05, the phosphorus-silicon ratio of the second oxygen-containing seed layer is greater than or equal to 0.05 and less than 0.3, the phosphorus-silicon ratio of the N-type doped host layer is greater than or equal to 0.06 and less than 1, and the phosphorus-silicon ratio of the N-type doped contact layer is greater than or equal to 0.06 and less than 1.

The doping element of the N-type doped layer is an N-type semiconductor material, and the N-type semiconductor material includes phosphorus elements, or other elements (such as arsenic and antimony). The N-type doped layer may be located at the light-incident surface.

The first oxygen-containing seed layer needs to possess the high crystallization rate. However, the high crystallization rate can lead to the contraction of the bandgap, thereby resulting in discontinuous bandgaps. Therefore, the transmission of current carriers is influenced. In order to solve the problem, the positions of a bandgap and a Fermi level can be adjusted by the low-oxygen doping method, thereby ensuring the coherence of the bandgap. Compared with the first oxygen-containing seed layer, the second oxygen-containing seed layer has the larger silicon-oxygen ratio and the phosphorus-silicon ratio, the second oxygen-containing seed layer is taken as a supplementary layer of the first oxygen-containing seed layer and belongs to a buffer transition layer. The second oxygen-containing seed layer can reduce the instability of the N-type doped host layer in the early preparation process. The combination of the first oxygen-containing seed layer and the second oxygen-containing seed layer can improve the crystallization rate of the N-type doped host layer. The N-type doped host layer is a main structure of the N-type doped layer. The N-type doped host layer with a high-oxygen content and a high-phosphorus content enhances the conductivity while ensuring the light transmittance, thereby maintaining a balance between the electrical property and the optical property. The N-type doped contact layer with an oxygen-free and a high-phosphorus content forms a good ohmic contact with the first transparent conductive oxide layer, thereby improving the fill factor and the current density of the solar cell.

In some embodiments, the silicon-oxygen ratio of the first oxygen-containing seed layer, the silicon-oxygen ratio of the second oxygen-containing seed layer, and the silicon-oxygen ratio of the N-type doped host layer increase sequentially.

In some embodiments, the silicon-oxygen ratio of the first oxygen-containing seed layer is 0.1-0.35, the silicon-oxygen ratio of the second oxygen-containing seed layer is 0.4-0.58, and the silicon-oxygen ratio of the N-type doped host layer is 0.6-0.95. For example, the silicon-oxygen ratio of the first oxygen-containing seed layer may be 0.1, 0.15, 0.2, 0.25, 0.3, or 0.35, the silicon-oxygen ratio of the second oxygen-containing seed layer may be 0.4, 0.45, 0.5, 0.55, or 0.58, and the silicon-oxygen ratio of the N-type doped host layer is 0.6, 0.65, 0.7, 0.75, 0.8, 0.85, 0.9, or 0.95.

In some embodiments, the phosphorus-silicon ratio of the first oxygen-containing seed layer, the phosphorus-silicon ratio of the second oxygen-containing seed layer, the phosphorus-silicon ratio of the N-type doped host layer and the phosphorus-silicon ratio of the N-type doped contact layer increase sequentially.

In some embodiments, the phosphorus-silicon ratio of the first oxygen-containing seed layer is 0.01-0.045, the phosphorus-silicon ratio of the second oxygen-containing seed layer is 0.05-0.25, the phosphorus-silicon ratio of the N-type doped host layer is 0.06-0.98, and the phosphorus-silicon ratio of the N-type doped contact layer is 0.06-0.98. For example, the phosphorus-silicon ratio of the first oxygen-containing seed layer may be 0.01, 0.015, 0.018, 0.02, 0.03, 0.04, or 0.045, the phosphorus-silicon ratio of the second oxygen-containing seed layer may be 0.05, 0.06, 0.07, 0.08, 0.1, 0.15, 0.2, or 0.25, the phosphorus-silicon ratio of the N-type doped host layer may be 0.06, 0.1, 0.15, 0.2, 0.3, 0.4, 0.5, 0.6, 0.7, 0.8, 0.9, or 0.98, and the phosphorus-silicon ratio of the N-type doped contact layer may be 0.06, 0.1, 0.2, 0.3, 0.4, 0.5, 0.6, 0.7, 0.8, 0.9, or 0.98.

In some embodiments, the crystallization rate of the first oxygen-containing seed layer is 52%-70%; the crystallization rate of the second oxygen-containing seed layer is 50.5%-68%; the crystallization rate of the N-type doped host layer is greater than 10% and less than 50%, and the crystallization rate of the N-type doped contact layer is greater than 0% and less than 50%; where, the crystallization rate of the second oxygen-containing seed layer is lower than that of the first oxygen-containing seed layer.

If the crystallization rate of the N-type doped layer is too high, the recombination degree of electrons and holes of the valence band is higher, thereby increasing the loss of the fill factor. If the crystallization rate of the N-type doped layer is too low, it may be unfavorable to carrier transport, thereby decreasing the fill factor. In order to improve the fill factor of the cell, the crystallization rate of the N-type doped layer needs to be reasonably controlled. The crystallization rate of the N-type doped layer in the embodiment of the present application may be controlled by arranging a plurality of sublayers. The first oxygen-containing seed layer belongs to a seed layer with a high crystallization rate and possesses the crystallization induction effect. The second oxygen-containing seed layer also belongs to a seed layer with a high crystallization rate, and the crystallization rate of the second oxygen-containing seed layer is slightly less than that of the first oxygen-containing seed layer, so that the second oxygen-containing seed layer possesses a transition buffer effect. The crystallization rate of the N-type doped host layer is lower, and the N-type doped host layer possesses excellent photoelectric conversion performance. The N-type doped contact layer with a low crystallization rate can reduce the contact resistance between the N-type doped layer and the first transparent oxide layer, thereby improving the fill factor of the solar cell and the optical performance.

In some embodiments, the crystallization rate of the first oxygen-containing seed layer, the crystallization rate of the second oxygen-containing seed layer, the crystallization rate of the N-type doped host layer and the crystallization rate of the N-type doped contact layer decrease sequentially.

In some embodiments, the crystallization rate of the first oxygen-containing seed layer is 55-69% (for example, 55%, 60%, 65%, or 69%); the crystallization rate of the second oxygen-containing seed layer is 51-65% (for example, 51%, 55%, 60%, or 65%); the crystallization rate of the N-type doped host layer is 12-45% (for example, 12%, 20%, 25%, 30%, 35%, 40%, or 45%), and the crystallization rate of the N-type doped contact layer is 5-45% (for example, 5%, 10%, 12%, 20%, 25%, 30%, 35%, 40%, or 45%); where the crystallization rate of the second oxygen-containing seed layer is lower than that of the first oxygen-containing seed layer.

In some embodiments, the carbon-silicon ratio of the N-type doped host layer is 0.01-0.04. For example, the carbon-silicon ratio of the N-type doped host layer may be 0.01, 0.02, 0.03, or 0.04.

In some embodiments, the thickness of the first oxygen-containing seed layer and the second oxygen-containing seed layer are independently 0.1-1 nm (for example, 0.1 nm, 0.3 nm, 0.4 nm, 0.5 nm, 0.6 nm, 0.8 nm, or 1 nm). The thickness of the N-type doped host layer is 8-20 nm (for example, 8 nm, 10 nm, 11 nm, 12 nm, 14 nm, or 15 nm, 18 nm, or 20 nm). The thickness of the N-type doped contact layer is 1-3 nm (for example, 1 nm, 1.5 nm, 2 nm, 2.5 nm, or 3 nm).

In some embodiments, referring to FIG. 3 and FIG. 4, the silicon-based heterojunction solar cell further includes:
  a second passivation layer 310, a P-type doped layer 320, a second transparent conductive oxide layer 330, and a second electrode 340, which, along a second direction D2, are sequentially stacked on the back side of the silicon substrate 100;
  the P-type doped layer 320 includes: a P-type doped seed layer 321, a P-type doped host layer 322 and a P-type doped contact layer 323, which are sequentially stacked along a second direction D2;
  a second direction D2 is opposite the first direction D1.

In these embodiments, the boron-silicon ratio of the P-type doped seed layer is greater than 0.01 and less than 0.9, the boron-silicon ratio of the P-type doped host layer is greater than 0.04 and less than 0.95, the boron-silicon ratio of the P-type doped contact layer is greater than 0.06 and less than 1, and the boron-silicon ratio of the P-type doped seed layer is less than that of the P-type doped host layer; and/or the crystallization rate of the P-type doped seed layer is greater than 50% and less than 70%, the crystallization rate of the P-type doped host layer is greater than 25% and less than 60%, the crystallization rate of the P-type doped contact layer is greater than 20% and less than 50%, and the crystallization rate of the P-type doped seed layer is greater than that of the P-type doped host layer.

The doping element of the P-type doped layer is a P-type semiconductor material; the P-type semiconductor material includes boron elements and may also include other elements (such as gallium element). The P-type doped layer may be located at the backlight surface.

The P-type doped layer includes a P-type doped seed layer, a P-type doped host layer and a P-type doped contact layer which are sequentially stacked. The P-type doped seed layer belongs to the incubation layer and can improve the crystallization rate of the P-type doped host layer. Compared with the P-type doped host layer, the boron-silicon ratio of the P-type doped seed layer is lower, and the crystallization rate of the P-type doped seed layer is higher, because the diffusion rate of doping elements (such as boron atoms) in the P-type doped seed layer is higher. The P-type doped host layer is mainly used for conducting electricity, and the P-type doped host layer with a high boron content and a low crystallization rate can improve the electrical performance of the solar cell. The P-type doped contact layer with a high boron content can form a good ohmic contact with the second transparent conductive oxide layer, thereby improving the conductivity.

In some embodiments, the boron-silicon ratio of the P-type doped seed layer, the boron-silicon ratio of the P-type doped host layer, and the boron-silicon ratio of the P-type doped contact layer increase sequentially. In some embodiments, the crystallization rate of the P-type doped seed layer, the crystallization rate of the P-type doped host layer and the crystallization rate of the P-type doped contact layer decrease sequentially.

In some embodiments, the boron-silicon ratio of the P-type doped seed layer is 0.02-0.3 (for example, 0.02, 0.04, 0.05, 0.08, 0.1, 0.14, 0.2, or 0.3), the boron-silicon ratio of the P-type doped host layer is 0.05-0.5 (0.05, 0.07, 0.1, 0.15, 0.2, 0.3, 0.4, or 0.5), and the boron-silicon ratio of the P-type doped contact layer is 0.08-0.98 (for example, 0.08, 0.1, 0.15, 0.2, 0.3, 0.4, 0.5, 0.6, 0.65, 0.7, 0.8, 0.9, or 0.98), where the boron-silicon ratio of the P-type doped seed layer is less than that of the P-type doped host layer.

In some embodiments, the crystallization rate of the P-type doped seed layer is 55-69% (for example, 55%, 60%, 65%, or 69%); the crystallization rate of the P-type doped host layer is 30-55% (for example, 12%, 30%, 35%, 40%, 45%, 50%, or 55%), and the crystallization rate of the P-type doped contact layer is 21-45% (for example, 21%, 25%, 30%, 35%, 40%, or 45%), where the crystallization rate of the P-type doped seed layer is greater than that of the P-type doped host layer.

In some embodiments, the thickness of the P-type doped seed layer is 1-2 nm (for example, 1 nm, 1.3 nm, 1.5 nm, 1.7 nm, or 2 nm), the thickness of the P-type doped host layer is 20-30 nm (for example, 20 nm, 22 nm, 23 nm, 25 nm, 26 nm, 27 nm, 28 nm, or 30 nm), and the thickness of the P-type doped contact layer is 2-4 nm (for example, 2 nm, 3 nm, or 4 nm).

In some embodiments, referring to FIG. 3 and FIG. 4, the second passivation layer 310 includes a third intrinsic amorphous silicon layer 311, a fourth intrinsic amorphous silicon layer 312, and a fifth intrinsic amorphous silicon layer 313, which are sequentially stacked along the second direction D2;

where the structural factor of the third intrinsic amorphous silicon layer is greater than that of the fourth intrinsic amorphous silicon layer, and the structural factor of the fourth intrinsic amorphous silicon layer is greater than that of the fifth intrinsic amorphous silicon layer.

The second passivation layer includes three intrinsic amorphous silicon layers with different structural factors. In the intrinsic amorphous silicon layer, the higher the structural factor is, the lower the compactness will be, the better the passivation effect will be, and the worse the conductive effect will be. Therefore, the third intrinsic amorphous silicon layer close to the silicon substrate has the higher structural factor, the lower compactness and the good passivation effect. The fifth intrinsic amorphous silicon layer close to the P-type doped layer has the lower structural factor, the higher compactness, the excellent passivation performance, and the excellent conductivity.

In some embodiments, the structural factor of the third intrinsic amorphous silicon layer is 0.5-0.7; the structural factor of the fourth intrinsic amorphous silicon layer is 0.4-0.6; and the structural factor of the fifth intrinsic amorphous silicon layer is 0.2-0.4. For example, the structural factor of the third intrinsic amorphous silicon layer may be 0.5, 0.55, 0.6, 0.63, 0.65, or 0.7, the structural factor of the fourth intrinsic amorphous silicon layer may be 0.4, 0.45, 0.47, 0.5, 0.52, 0.55, or 0.6, and the structural factor of the fifth intrinsic amorphous silicon layer may be 0.2, 0.25, 0.3, 0.35, 0.38, or 0.4.

In some embodiments, the thickness of the third intrinsic amorphous silicon layer is 0.5-2 nm (for example, 0.5 nm, 1 nm, 1.5 nm, or 2 nm), the thickness of the fourth intrinsic amorphous silicon layer is 1-2.5 nm (for example, 1 nm, 1.5 nm, 2 nm, or 2.5 nm), and the thickness of the fifth intrinsic amorphous silicon layer is 4-8 nm (for example, 4 nm, 4.5 nm, 5 nm, 5.5 nm, 6 nm, 6.5 nm, 7 nm, 7.5 nm, or 8 nm).

In some embodiments, the material of the first transparent conductive oxide layer and the material of the second transparent conductive oxide layer respectively and independently include one or more of indium tin oxide (ITO), indium zinc oxide (IZO), tungsten doped indium oxide (IWO), fluorine doped tin oxide (FTO), cerium doped indium oxide (ICO), aluminum doped zinc oxide (AZO), boron doped zinc oxide (BZO), and VTTO. Where the composition of VTTO includes $In_2O_3$, $ZrO_2$, $TiO_2$ and $Ga_2O_3$ by a mass ratio of 98.5:0.5:0.5:0.5. The material of these transparent conductive oxide layer possesses the high light transmittance and the high conductivity.

In some embodiments, the textured thickness of the first transparent conductive oxide layer is 65-70 nm (for example, 65 nm, 68 nm, 70 nm), and the refractive index of the first transparent conductive oxide layer is 1.8-2.1 (for example, 1.8, 1.9, 1.97, 2.0, or 2.1).

In some embodiments, the textured thickness of the second transparent conductive oxide layer is 75-80 nm (for example, 75 nm, 77 nm, 80 nm), and the refractive index of the second transparent conductive oxide layer is 1.8-2.1 (for example, 1.8, 1.9, 1.97, 2.0, or 2.1).

In some embodiments, the first electrode and the second electrode respectively and independently include one or more of Au, Ag, Al, Cu. The thickness of the first electrode and the thickness of the second electrode may be respectively and independently 100-200 nm (for example, 100 nm, 150 nm, or 200 nm).

In some embodiments, P-gate-lines and N-gate-lines can form the second electrode and the first electrode respectively, and the compactness of the P-gate-lines is greater than that of the N-gate-lines.

In the present application, the crystallization rate can be measured by Raman spectrometer, where the wavelength of incident light is 632.8 nm. When the Raman spectrum of the film with amorphous, crystalline and small crystal grains is decomposed by Lorentzian, three characteristic peaks will appear at 480 cm$^{-1}$, 510 cm$^{-1}$ and 520 cm$^{-1}$ respectively. The three characteristic peaks respectively correspond to the amorphous, the small crystal grains and the crystalline. And the calculation formula of the crystallization ratio ($X_c$) is: $X_c=(I_{510}+I_{520})/(I_{480}+I_{510}+I_{520})$; where $I_{480}$, $I_{510}$ and $I_{520}$ respectively represent the relative integral intensity of the peaks of the Raman spectrum at 480 cm$^{-1}$, 510 cm$^{-1}$ and 520 cm$^{-1}$.

The embodiment of the present application provides a method for manufacturing a silicon-based heterojunction solar cell, which includes the following steps:

Step S110: a silicon substrate 100 is provided, the silicon substrate 100 includes a front side and a back side, which are arranged opposite to each other.

In step S110, a textured pyramid may be formed on the surface of the silicon substrate 100. The specific steps of the formation of the textured pyramid on the surface of the silicon substrate 100 may include: the silicon substrate 100 is cleaned to remove damage and is subjected to texturing treatment to form the pyramid structure with uniform size on the surface of the silicon substrate 100; then, organic matters and metal ions on the surface are removed through the RCA (radio CorPoration of America) cleaning process, and the pyramid structure is rounded through the Rounding process; finally, an oxidation layer is removed through hydrofluoric acid solution to form a textured pyramid.

The textured pyramids formed on the surface of the silicon substrate 100 are uneven structures with uniform sizes, the micro-morphology is similar to pyramids. When incident light enters the surface of the silicon substrate 100 from different angles, the textured pyramids can increase the absorption of light, so that the short-circuit current and the conversion efficiency of the cell can be improved.

Step S120: a first sub-passivation layer 211, a carbon-doped amorphous silicon layer 212 and a second sub-passivation layer 213 are sequentially formed on the front side of the silicon substrate 100; where the first sub-passivation layer 211, the carbon-doped amorphous silicon layer 212 and the second sub-passivation layer 213 jointly constitute the first passivation layer 210.

In step S120, a first sub-passivation layer 211 may be formed on the front side of the substrate by the chemical vapor deposition method (for example, Plasma Enhanced Chemical Vapor Deposition method, PECVD); the carbon-doped amorphous silicon layer 212 can be formed by introducing methane gas based on the manufacturing process of the amorphous silicon; the second sub-passivation layer 213 may be formed on the surface of the carbon-doped amorphous silicon layer 212 by the low pressure chemical vapor deposition method.

In some embodiments, the first sub-passivation layer 211, the carbon-doped amorphous silicon layer 212, and the second sub-passivation layer 213 are formed sequentially by co-doping of carbon and oxygen, where the carbon-doped amorphous silicon layer 212 is beneficial to optimize the conductivity of the film, so that the N-type doped layer 220 can possess the excellent optical performance and the excellent electrical performance.

Step S130: an N-type doped layer 220 is formed on the second sub-passivation layer 213.

In step S130, an N-type doped layer 220 may be formed on the second sub-passivation layer 213 by the chemical vapor deposition method (for example, Plasma Enhanced Chemical Vapor Deposition method, PECVD) by hydrogen, silane, phosphine, and carbon dioxide. Where the doping material is an N-type semiconductor material, and the N-type semiconductor material includes phosphorus elements and other elements (such as arsenic and antimony).

In some embodiments, in the step S130, the formation of the N-type doped layer 220 on the second sub-passivation layer 213 includes: a first oxygen-containing seed layer 221, a second oxygen-containing seed layer 222, an N-type doped host layer 223 and an N-type doped contact layer 224 are sequentially formed on the second sub-passivation layer 213, by adjusting the amounts of hydrogen, silane, phosphine and carbon dioxide. The first oxygen-containing seed layer 221, the second oxygen-containing seed layer 222, the N-type doped host layer 223, and the N-type doped contact layer 224 jointly constitute the N-type doped layer 220.

Step S140: a first transparent conductive oxide layer 230 is formed on the N-type doped layer 220.

In step S140, VTTO is deposited on the N-type doped layer 220 by the vacuum evaporation coating method (PVD) or the vacuum ion plating method (RPD), to form the first transparent conductive oxide layer 230.

Step S150: a first electrode 240 is formed on the first transparent conductive oxide layer 230.

In step S150, a first electrode 240 may be formed on the first transparent conductive oxide layer 230 by the screen-printing method or the electroplating method.

In some embodiments, after the silicon substrate 100 is provided and before the first sub-passivation layer 211 is formed, the method for manufacturing a silicon-based heterojunction solar cell further includes:

Step S160: a pre-passivation layer 250 is formed on the front side of the silicon substrate 100 by successively employing a slow-lifting process in hot water and a plasma-etching process; where the material of the pre-passivation layer 250 includes silicon oxide.

In step S160, the formation of the pre-passivation layer 250 on the front side of the silicon substrate 100 includes:

Step S161: a silicon oxide protective layer is formed on the front side and the back side of the silicon substrate 100 by the slow-lifting process in hot water;

Step S162: the silicon oxide protective layer on the back of the silicon substrate 100 is removed by a first plasma-etching process;

Step S163: the silicon oxide protection layer on the front side of the silicon substrate 100 is treated by a second plasma-etching process to remove physical adsorption impurities, and the silicon oxide protection layer on the front side of the silicon substrate 100 is transformed into the pre-passivation layer 250.

By employing the slow-lifting process in hot water, silicon oxide materials can be uniformly deposited on the surface of the silicon substrate 100, which is beneficial to form a silicon oxide protective layer with uniform thickness and good performance. The silicon oxide protective layer can completely cover the silicon substrate 100 even at a relatively low thickness, thereby optimizing the passivation performance. The silicon oxide protective layer does not affect the transmission of electrons but blocks the transmission of holes, so the silicon oxide protective layer on the back side of the silicon substrate 100 is removed by the first plasma-etching process, and the silicon oxide protective layer on the front side of the silicon substrate 100 is reserved, to avoid affecting the transmission of holes on the back side of the substrate. By employing a second plasma-etching process, the physically adsorbed impurities, on the surface of the silicon oxide protective layer on the front side of the substrate, are removed, weak bonds in the silicon oxide layer are removed simultaneously. Therefore, the impurity content of the pre-passivation layer 250 is lower, and the passivation effect can be improved.

In step S162, the first plasma-etching process may be a hydrogen plasma-etching process with a radio frequency (RF) power of 380-430 W and an etching time of 8-12 s. For example, the RF power may be 380 W, 400 W, 420 W, or 430 W, and the etching time may be 8 s, 10 s, or 12 s.

In step S163, the second plasma-etching process may be a hydrogen plasma-etching process with a RF power is 320-380 W and an etching time of 3-7 s. For example, the RF power may be 320 W, 350 W, 360 W or 380 W, and the etching time may be 3 s, 5 s or 7 s.

In some embodiments, the method for manufacturing a silicon-based heterojunction solar cell further includes:

Step S210: a second passivation layer 310 is formed on the back side of the silicon substrate 100.

In step S210, a third intrinsic amorphous silicon layer 311, a fourth intrinsic amorphous silicon layer 312, and a fifth intrinsic amorphous silicon layer 313 are sequentially formed on the back side of the silicon substrate 100 by the chemical vapor deposition method. Where the compactness of the third intrinsic amorphous silicon layer 311 is less than that of the fourth intrinsic amorphous silicon layer 312, and the compactness of the fourth intrinsic amorphous silicon layer 312 is less than that of the fifth intrinsic amorphous silicon layer 313.

Step S220: a P-type doped seed layer 321, a P-type doped host layer 322 and a P-type doped contact layer 323 are sequentially formed on the second passivation layer 310; where the P-type doped seed layer 321, the P-type doped host layer 322 and the P-type doped contact layer 323 jointly constitute a P-type doped layer 320.

Step S230: a second transparent conductive oxide layer 330 is formed on the P-type doped contact layer 323.

Step S240: a second electrode 340 is formed on the second transparent conductive oxide layer 330.

In some embodiments, a method for manufacturing a silicon-based heterojunction solar cell includes:

Step S310: a silicon substrate 100 is provided, the silicon substrate 100 includes a front side and a back side which are arranged opposite to each other;

Step S320: a pre-passivation layer 250 is formed on the front side of the silicon substrate 100; where the material of the pre-passivation layer 250 includes silicon oxide; the pre-passivation layer 250 is formed by successively employing a slow-lifting process in hot water and a plasma-etching process;

Step S330: a first sub-passivation layer 211, a carbon-doped amorphous silicon layer 212 and a second sub-passivation layer 213 are sequentially formed on the pre-passivation layer 250; where the first sub-passivation layer 211, the carbon-doped amorphous silicon layer 212 and the second sub-passivation layer 213 jointly constitute a first passivation layer 210;

Step S340: a third intrinsic amorphous silicon layer 311, a fourth intrinsic amorphous silicon layer 312, and a fifth intrinsic amorphous silicon layer 313 are sequentially formed on the back side of the silicon substrate 100; where the third intrinsic amorphous silicon layer 311, the fourth intrinsic amorphous silicon layer 312 and the fifth intrinsic amorphous silicon layer 313 jointly constitute a second passivation layer 310;

Step S350: a first oxygen-containing seed layer 221, a second oxygen-containing seed layer 222, an N-type doped host layer 223, and an N-type doped contact layer 224 are sequentially formed on the second sub-passivation layer 213; where the first oxygen-containing seed layer 221, the second oxygen-containing seed layer 222, the N-type doped host layer 223, and the N-type doped contact layer 224 jointly constitute the N-type doped layer 220;

Step S360: a P-type doped seed layer 321, a P-type doped host layer 322 and a P-type doped contact layer 323 are sequentially formed on the second passivation layer 310; where the P-type doped seed layer 321, the P-type doped host layer 322 and the P-type doped contact layer 323 jointly constitute a P-type doped layer 320;

Step S370: a first transparent conductive oxide layer 230 is formed on the N-type doped layer 220, and a second transparent conductive oxide layer 330 is formed on the P-type doped contact layer 323;

Step S380: a first electrode 240 is formed on the first transparent conductive oxide layer 230, and a second electrode 340 is formed on the second transparent conductive oxide layer 330.

The following specific Embodiments further illustrate the present application in detail, rather than to limit the scope of the present application. Any modifications or substitutions to the embodiments of the present application may be made without departing from the spirit and scope of the present application.

Embodiment 1

Referring to FIG. 1, this embodiment provides a silicon-based heterojunction solar cell, which includes a silicon substrate 100, the silicon substrate 100 includes a front side and a back side which are opposite to each other; the silicon substrate 100 is an N-type monocrystalline silicon substrate.

Along the first direction D1, a first sub-passivation layer 211, a carbon-doped amorphous silicon layer 212, a second sub-passivation layer 213, an N-type doped layer 220, a first transparent conductive oxide layer 230, and a first electrode 240 are sequentially stacked on the front side of the silicon substrate 100. Where the first sub-passivation layer 211, the carbon-doped amorphous silicon layer 212, and the second sub-passivation layer 213 jointly constitute a first passivation layer 210; the first sub-passivation layer 211 is a first intrinsic amorphous silicon layer, and the second sub-passivation layer 213 is a second intrinsic amorphous silicon layer.

Along the second direction D2, a second passivation layer 310, a P-type doped layer 320, a second transparent conductive oxide layer 330, and a second electrode 340 are sequentially stacked on the back side of the silicon substrate 100.

The second direction D2 is opposite to the first direction D1.

This embodiment provides a method for manufacturing a silicon-based heterojunction solar cell, which includes:

Step S410: a silicon substrate 100 is provided, the silicon substrate 100 includes a front side and a back side, which are arranged opposite to each other.

The silicon substrate 100 is cleaned to remove damage and is subjected to texturing treatment to form the pyramid structure with uniform size on the surface of the silicon substrate 100. Then, organic matters and metal ions on the surface are removed through the RCA (radio CorPoration of America) cleaning process, and the pyramid structure is rounded through the Rounding process. Finally, an oxidation layer is removed through hydrofluoric acid solution to form a textured pyramid on the surface of the silicon substrate 100.

Step S420: a first sub-passivation layer 211 is formed on the front side of the substrate by hydrogen and silane with the PECVD apparatus; a carbon-doped amorphous silicon layer 212 is formed on the first sub-passivation layer 211 by increasing the hydrogen/silane ratio and introducing methane gas, with the PECVD apparatus; a second sub-passivation layer 213 is formed on the carbon-doped amorphous silicon layer 212 by further increasing the hydrogen/silane ratio and ceasing the introduction of methane gas, with the PECVD apparatus; where, the first sub-passivation layer 211, carbon-doped amorphous silicon layer 212, and second sub-passivation layer 213 jointly constitute the first passivation layer 210.

The structural factor of the first sub-passivation layer 211 is 0.6, and the thickness of the first sub-passivation layer 211 is 0.8 nm.

The structural factor of the carbon-doped amorphous silicon layer 212 is 0.45, the carbon content of the carbon-doped amorphous silicon layer 212 is 4.4 at %, and the thickness of the carbon-doped amorphous silicon layer 212 is 0.8 nm.

The structural factor of the second sub-passivation layer 213 is 0.3, and the thickness of the second sub-passivation layer 213 is 5 nm.

Step S430: a second passivation layer 310 with a thickness of 12 nm is formed on the back side of the silicon substrate 100 by hydrogen and silane, with the PECVD method.

Step S440: an N-type doped layer 220 is formed on the first sub-passivation layer 211 by hydrogen, silane, phosphine, and carbon dioxide, with the PECVD apparatus.

The silicon-oxygen ratio of the N-type doped layer 220 is 0.8, the phosphorus-silicon ratio of the N-type doped layer 220 is 0.7, the crystallization rate of the N-type doped layer 220 is 40%, and the thickness of the N-type doped layer 220 is 28 nm.

Step S450: a P-type doped layer 320 with a thickness of 32 nm is formed on the second passivation layer 310 by hydrogen, silane, and diborane, with the PECVD apparatus.

Step S460: a first transparent conductive oxide layer 230 is formed on the N-type doped layer 220 by VTTO, with the PVD method;

and a second transparent conductive oxide layer 330 is formed on the P-type doped layer 320 by VTTO, with the PVD method.

The textured thickness of the first transparent conductive oxide layer 230 is 68 nm, and the refractive index of the first transparent conductive oxide layer 230 is 1.97.

The textured thickness of the second transparent conductive oxide layer 330 is 75 nm, and the refractive index of the second transparent conductive oxide layer 330 is 1.97.

Step S470: primary and secondary grid lines are formed on the first transparent conductive oxide layer 230 by the screen-printing, then the grid lines are cured and subjected to light injection to form the first electrode 240; and primary and secondary grid lines are formed on the second transparent conductive oxide layer 330 by the screen-printing, then the grid lines are cured and subjected to light injection to form the second electrode 340.

Embodiment 2

This embodiment provides a silicon-based heterojunction solar cell and a manufacturing method thereof, which are essential the same as those of embodiment 1, the differences are as follows.

The structural factor of the first sub-passivation layer is 0.65, and the thickness of the first sub-passivation layer is 1 nm.

The structural factor of the carbon-doped amorphous silicon layer is 0.58, and the carbon content of the carbon-doped amorphous silicon layer is 4 at % and a thickness of the carbon-doped amorphous silicon layer is 1 nm.

The structural factor of the second sub-passivation layer is 0.43, and the thickness of the second sub-passivation layer is 5 nm.

Embodiment 3

This embodiment provides a silicon-based heterojunction solar cell and a manufacturing method thereof, which are essential the same as those of embodiment 1, the differences are as follows.

The structural factor of the first sub-passivation layer is 0.75, the thickness of the first sub-passivation layer is 0.8 nm, and the first sub-passivation layer is a first oxygen-doped amorphous silicon layer with the silicon-oxygen ratio of 0.6.

The structural factor of the carbon-doped amorphous silicon layer is 0.5, and the carbon content of the carbon-doped amorphous silicon layer is 4.2 at % and the thickness of the carbon-doped amorphous silicon layer is 0.8 nm.

The structural factor of the second sub-passivation layer is 0.3, the thickness of the second sub-passivation layer is 4.8 nm, and the second sub-passivation layer is a second intrinsic amorphous silicon layer.

Step S420 includes: the first sub-passivation layer is formed on the front side of the silicon substrate by hydrogen, silane, and carbon dioxide gases, with the PECVD apparatus; the carbon-doped amorphous silicon layer is formed on the first sub-passivation layer by increasing the hydrogen/silane ratio, introducing methane gas and ceasing the introduction of carbon dioxide gas, with the PECVD apparatus; the second sub-passivation layer is formed on the carbon-doped amorphous silicon layer by further increasing the hydrogen/silane ratio and ceasing the introduction of methane gas, with the PECVD apparatus; where, the first sub-passivation layer, the carbon-doped amorphous silicon layer, and second sub-passivation layer jointly constitute the first passivation layer.

Embodiment 4

This embodiment provides a silicon-based heterojunction solar cell and a manufacturing method thereof, which are essential the same as those of embodiment 1, the differences are as follows.

The structural factor of the first sub-passivation layer is 0.7, and the thickness of the first sub-passivation layer is 1 nm, and the first sub-passivation layer is a first intrinsic amorphous silicon layer.

The structural factor of the carbon-doped amorphous silicon layer is 0.55, the carbon content of the carbon-doped amorphous silicon layer is 3 at %, and the thickness of the carbon-doped amorphous silicon layer is 1 nm.

The structural factor of the second sub-passivation layer is 0.35, the thickness of the second sub-passivation layer is 6 nm, and the second sub-passivation layer is a second oxygen-doped amorphous silicon layer with the silicon-oxygen ratio of 0.8.

Step S420 includes: the first sub-passivation layer is formed on the front side of the silicon substrate by hydrogen and silane, with the PECVD apparatus; the carbon-doped amorphous silicon layer is formed on the first sub-passivation layer by increasing the hydrogen/silane ratio and introducing methane gas, with the PECVD apparatus; the second sub-passivation layer is formed on the carbon-doped amorphous silicon layer by further increasing the hydrogen/silane ratio, introducing carbon dioxide gas and ceasing the introduction of methane gas, with the PECVD apparatus; where, the first sub-passivation layer, the carbon-doped amorphous silicon layer, and the second sub-passivation layer jointly constitute the first passivation layer.

Embodiment 5

Referring to FIG. 2, this embodiment provides a silicon-based heterojunction solar cell and a manufacturing method thereof, which are essential the same as those of embodiment 1, the differences are as follows.

A pre-passivation layer 250 is arranged between the silicon substrate 100 and the first sub-passivation layer 211.

The method for manufacturing the silicon-based heterojunction solar cell of Embodiment 5, between Steps S410 and S420, further includes: Step S480: a pre-passivation layer 250 is formed on the front side of the silicon substrate 100.

Step S420 includes: the first sub-passivation layer 211 is formed on the pre-passivation layer 250 by hydrogen and silane, with the PECVD apparatus;

Step S480, the formation of the pre-passivation layer 250 on the front side of the silicon substrate 100 includes:

Step S481: a silicon oxide protective layer is formed on the front side and the back side of the silicon substrate 100 by the slow-lifting process in hot water.

Step S482: the silicon oxide protective layer on the back side of the silicon substrate 100 is removed by the first plasma-etching process; where the first plasma-etching process is a hydrogen plasma-etching process with a radio frequency power of 400 W and an etching time of 10 s.

Step S483: the silicon oxide protective layer on the front side of the silicon substrate 100 is treated by the second plasma-etching process to remove physically adsorbed impurities, and the silicon oxide protective layer on the front side of the silicon substrate 100 is transformed into a pre-passivation layer 250; where the second plasma-etching process is a hydrogen plasma-etching process with a radio frequency power of 350 W and an etching time of 5 s.

Embodiment 6

Referring to FIG. 3, this embodiment provides a silicon-based heterojunction solar cell, which includes a silicon substrate 100, the silicon substrate 100 includes a front side and a back side which are opposite to each other; the silicon substrate 100 is an N-type monocrystalline silicon substrate.

Along the first direction D1, a first sub-passivation layer 211, a carbon-doped amorphous silicon layer 212, a second sub-passivation layer 213, a first oxygen-containing seed layer 221, a second oxygen-containing seed layer 222, an N-type doped host layer 223, an N-type doped contact layer 224, a first transparent conductive oxide layer 230, and a first electrode 240 are sequentially stacked on the front side of the silicon substrate 100. Where, the first sub-passivation layer 211, the carbon-doped amorphous silicon layer 212, and the second sub-passivation layer 213 jointly constitute a first passivation layer 210; the first oxygen-containing seed layer 221, the second oxygen-containing seed layer 222, the N-type doped host layer 223, and the N-type doped contact layer 224 jointly constitute an N-type doped layer 220; the first sub-passivation layer 211 is a first intrinsic amorphous silicon layer, and the second sub-passivation layer 213 is a second intrinsic amorphous silicon layer.

Along the second direction D2, a third intrinsic amorphous silicon layer 311, a fourth intrinsic amorphous silicon layer 312, a fifth intrinsic amorphous silicon layer 313, a P-type doped seed layer 321, a P-type doped host layer 322, a P-type doped contact layer 323, a second transparent conductive oxide layer 330, and a second electrode 340 are sequentially stacked on the back side of the silicon substrate 100. Where, the third intrinsic amorphous silicon layer 311, the fourth intrinsic amorphous silicon layer 312, and the fifth intrinsic amorphous silicon layer 313 jointly constitute a second passivation layer 310; the P-type doped seed layer 321, the P-type doped host layer 322, and the P-type doped contact layer 323 jointly constitute a P-type doped layer 320.

The second direction D2 is opposite to the first direction D1.

This embodiment provides a method for manufacturing a silicon-based heterojunction solar cell, which includes:

Step S510: a silicon substrate 100 is provided, the silicon substrate 100 includes a front side and a back side, which are arranged opposite to each other.

The silicon substrate 100 is cleaned to remove damage and is subjected to texturing treatment to form the pyramid structure with uniform size on the surface of the silicon substrate 100. Then, organic matters and metal ions on the surface are removed through the RCA (radio CorPoration of America) cleaning process, and the pyramid structure is rounded through the Rounding process. Finally, an oxidation layer is removed through hydrofluoric acid solution to form the textured pyramid on the surface of the silicon substrate 100.

Step S520: a first sub-passivation layer 211 is formed on the front side of the substrate by hydrogen and silane with the PECVD apparatus; a carbon-doped amorphous silicon layer 212 is formed on the first sub-passivation layer 211 by increasing the hydrogen/silane ratio and introducing methane gas, with the PECVD apparatus; a second sub-passivation layer 213 is formed on the carbon-doped amorphous silicon layer 212 by further increasing the hydrogen/silane ratio and ceasing the introduction of methane gas, with the PECVD apparatus; where, the first sub-passivation layer 211, carbon-doped amorphous silicon layer 212, and second sub-passivation layer 213 jointly constitute the first passivation layer 210.

The structural factor of the first sub-passivation layer 211 is 0.6, and the thickness of the first sub-passivation layer 211 is 0.8 nm.

the structural factor of the carbon-doped amorphous silicon layer 212 is 0.5, the carbon content of the carbon-doped amorphous silicon layer 212 is 4.4 at %, and the thickness of the carbon-doped amorphous silicon layer 212 is 0.8 nm.

The structural factor of the second sub-passivation layer 213 is 0.3, and the thickness of the second sub-passivation layer 213 is 5 nm.

Step S530: a third intrinsic amorphous silicon layer 311, a fourth intrinsic amorphous silicon layer 312, and a fifth intrinsic amorphous silicon layer 313 are sequentially formed on the back side of the silicon substrate 100 by adjusting the hydrogen/silane ratio, with the PECVD method; where, the third intrinsic amorphous silicon layer 311, the fourth intrinsic amorphous silicon layer 312, and the fifth intrinsic amorphous silicon layer 313 jointly constitute the second passivation layer 310.

The structural factor of the third intrinsic amorphous silicon layer 311 is 0.6, and the thickness of the third intrinsic amorphous silicon layer 311 is 1 nm.

The structural factor of the fourth intrinsic amorphous silicon layer 312 is 0.5, and the thickness of the fourth intrinsic amorphous silicon layer 312 is 1.5 nm.

The structural factor of the fifth intrinsic amorphous silicon layer 313 is 0.3, and the thickness of the fourth intrinsic amorphous silicon layer 312 is 6 nm.

Step S540: a first oxygen-containing seed layer 221, a second oxygen-containing seed layer 222, an N-type doped host layer 223, and an N-type doped contact layer 224 are sequentially formed on the second sub-passivation layer 213 by adjusting the amounts of hydrogen, silane, phosphine, and carbon dioxide gases, with the PECVD apparatus; where, the first oxygen-containing seed layer 221, the second oxygen-containing seed layer 222, the N-type doped host layer 223, and the N-type doped contact layer 224 jointly constitute the N-type doped layer 220.

The silicon-oxygen ratio of the first oxygen-containing seed layer 221 is 0.1, the phosphorus-silicon ratio of the first oxygen-containing seed layer 221 is 0.015, the crystallization rate of the first oxygen-containing seed layer 221 is 65%, and the thickness of the first oxygen-containing seed layer 221 is 0.8 nm.

The silicon-oxygen ratio of the second oxygen-containing seed layer 222 is 0.5, the phosphorus-silicon ratio of the second oxygen-containing seed layer 222 is 0.2, the crystallization rate of the second oxygen-containing seed layer 222 is 60%, and the thickness of the second oxygen-containing seed layer 222 is 0.8 nm.

The silicon-oxygen ratio of the N-type doped host layer 223 is 0.8, the phosphorus-silicon ratio of the N-type doped host layer 223 is 0.7, the crystallization rate of the N-type doped host layer 223 is 40%, and the thickness of the N-type doped host layer 223 is 18 nm.

The phosphorus-silicon ratio of the N-type doped contact layer 224 is 0.8, the crystallization rate of the N-type doped contact layer 224 is 40%, and the thickness of the N-type doped contact layer 224 is 2 nm;

Step S550: a P-type doped seed layer 321, a P-type doped host layer 322, and a P-type doped contact layer 323 are sequentially formed on the second passivation layer 310 by adjusting the amounts of hydrogen, silane, and diborane gases, with the PECVD apparatus; where, the P-type doped seed layer 321, the P-type doped host layer 322, and the P-type doped contact layer 323 jointly constitute the P-type doped layer 320.

The boron-silicon ratio of the P-type doped seed layer 321 is 0.02, the crystallization rate of the P-type doped seed layer 321 is 65%, and the thickness of the P-type doped seed layer 321 is 1.5 nm.

The boron-silicon ratio of the P-type doped host layer 322 is 0.06, the crystallization rate of the P-type doped host layer 322 is 55%, and the thickness of the P-type doped host layer 322 is 25 nm.

The boron-silicon ratio of the P-type doped contact layer 323 is 0.15, the crystallization rate of the P-type doped contact layer 323 is 35%, and the thickness of the P-type doped contact layer 323 is 3 nm.

Step S560: a first transparent conductive oxide layer 230 is formed on the N-type doped layer 220 by VTTO, with the PVD method.

The textured thickness of the first transparent conductive oxide layer 230 is 68 nm, and the refractive index of the first transparent conductive oxide layer 230 is 1.97.

The textured thickness of the second transparent conductive oxide layer 330 is 77 nm, and the refractive index of the second transparent conductive oxide layer 330 is 1.97.

Step S570: primary and secondary grid lines are formed on the first transparent conductive oxide layer 230 by the screen-printing, then the grid lines are cured and subjected to light injection to form the first electrode 240; and primary and secondary grid lines are formed on the second transparent conductive oxide layer 330 by the screen-printing, then the grid lines are cured and subjected to light injection to form the second electrode 340.

Embodiment 7

This embodiment provides a silicon-based heterojunction solar cell and a manufacturing method thereof, which are essential the same as those of embodiment 6, the differences are as follows.

The structural factor of the first sub-passivation layer is 0.65, and the thickness of the first sub-passivation layer is 1 nm.

The structural factor of the carbon-doped amorphous silicon layer is 0.55, and the carbon content of the carbon-doped amorphous silicon layer is 4.2 at %, and the thickness of the carbon-doped amorphous silicon layer is 1 nm.

The structural factor of the second sub-passivation layer is 0.38, and the thickness of the second sub-passivation layer is 7 nm.

The structural factor of the third intrinsic amorphous silicon layer is 0.55, and the thickness of the third intrinsic amorphous silicon layer is 1 nm.

The structural factor of the fourth intrinsic amorphous silicon layer is 0.45, and the thickness of the fourth intrinsic amorphous silicon layer is 2 nm.

The structural factor of the fifth intrinsic amorphous silicon layer is 0.3, and the thickness of the fifth intrinsic amorphous silicon layer is 6.5 nm.

The silicon-oxygen ratio of the first oxygen-containing seed layer is 0.2, the phosphorus-silicon ratio of the first oxygen-containing seed layer is 0.02, the crystallization rate of the first oxygen-containing seed layer is 65%, and the thickness of the first oxygen-containing seed layer is 0.6 nm.

The silicon-oxygen ratio of the second oxygen-containing seed layer is 0.5, the phosphorus-silicon ratio of the second oxygen-containing seed layer is 0.15, a crystallization rate of the second oxygen-containing seed layer is 55%, and the thickness of the second oxygen-containing seed layer is 0.8 nm.

The silicon-oxygen ratio of the N-type doped host layer is 0.85, the phosphorus-silicon ratio of the N-type doped host layer is 0.75, the crystallization rate of the N-type doped host layer is 35%, and the thickness of the N-type doped host layer is 15 nm.

The phosphorus-silicon ratio of the N-type doped contact layer is 0.8, the crystallization rate of the N-type doped contact layer is 30%, and the thickness of the N-type doped contact layer is 2.5 nm.

The boron-silicon ratio of the P-type doped seed layer is 0.02, the crystallization rate of the P-type doped seed layer is 65%, and the thickness of the P-type doped seed layer is 1.5 nm.

The boron-silicon ratio of the P-type doped host layer is 0.08, the crystallization rate of the P-type doped host layer is 55%, and the thickness of the P-type doped host layer is 26 nm.

The boron-silicon ratio of the P-type doped contact layer is 0.15, the crystallization rate of the P-type doped contact layer is 40%, and the thickness of the P-type doped contact layer is 2 nm.

Embodiment 8

This embodiment provides a silicon-based heterojunction solar cell and a manufacturing method thereof, which are essential the same as those of embodiment 6, the differences are as follows.

The structural factor of the first sub-passivation layer is 0.6, and the thickness of the first sub-passivation layer is 1 nm.

The structural factor of the carbon-doped amorphous silicon layer is 0.45, the carbon content of the carbon-doped amorphous silicon layer is 4 at %, and the thickness of the carbon-doped amorphous silicon layer is 1 nm.

The structural factor of the second sub-passivation layer is 0.35, and the thickness of the second sub-passivation layer is 6 nm.

The structural factor of the third intrinsic amorphous silicon layer is 0.5, and the thickness of the third intrinsic amorphous silicon layer is 1.5 nm.

The structural factor of the fourth intrinsic amorphous silicon layer is 0.4, and the thickness of the fourth intrinsic amorphous silicon layer is 1.5 nm.

The structural factor of the fifth intrinsic amorphous silicon layer is 0.25, and the thickness of the fifth intrinsic amorphous silicon layer is 7 nm.

The silicon-oxygen ratio of the first oxygen-containing seed layer is 0.2, the phosphorus-silicon ratio of the first oxygen-containing seed layer is 0.025, the crystallization rate of the first oxygen-containing seed layer is 60%, and the thickness of the first oxygen-containing seed layer is 1 nm.

The silicon-oxygen ratio of the second oxygen-containing seed layer is 0.45, the phosphorus-silicon ratio of the second oxygen-containing seed layer is 0.25, the crystallization rate of the second oxygen-containing seed layer is 51%, and the thickness of the second oxygen-containing seed layer is 1 nm.

The silicon-oxygen ratio of the N-type doped host layer is 0.7, the phosphorus-silicon ratio of the N-type doped host layer is 0.65, the crystallization rate of the N-type doped host layer is 40%, and the thickness of the N-type doped host layer is 12 nm.

The phosphorus-silicon ratio of the N-type doped contact layer is 0.75, the crystallization rate of the N-type doped contact layer is 35%, and the thickness of the N-type doped contact layer is 3 nm.

The boron-silicon ratio of the P-type doped seed layer is 0.03, the crystallization rate of the P-type doped seed layer is 60%, and the thickness of the P-type doped seed layer is 2 nm.

The boron-silicon ratio of the P-type doped host layer is 0.10, the crystallization rate of the P-type doped host layer is 50%, and the thickness of the P-type doped host layer is 23 nm.

The boron-silicon ratio of the P-type doped contact layer is 0.2, the crystallization rate of the P-type doped contact layer is 40%, and the thickness of the P-type doped contact layer is 2 nm.

Embodiment 9

This embodiment provides a silicon-based heterojunction solar cell and a manufacturing method thereof, which are essential the same as those of embodiment 6, the differences are as follows.

The structural factor of the first sub-passivation layer is 0.7, and the thickness of the first sub-passivation layer is 0.8 nm, and the first sub-passivation layer is a first oxygen-doped amorphous silicon layer with a silicon-oxygen ratio of 0.85.

The structural factor of the carbon-doped amorphous silicon layer is 0.5, the carbon content of the carbon-doped amorphous silicon layer is 4.3 at %, and the thickness of the carbon-doped amorphous silicon layer is 0.8 nm.

The structural factor of the second sub-passivation layer is 0.4, and the thickness of the second sub-passivation layer is 5 nm, and the second sub-passivation layer is a second intrinsic amorphous silicon layer.

The structural factor of the third intrinsic amorphous silicon layer is 0.65, and the thickness of the third intrinsic amorphous silicon layer is 1.5 nm.

The structural factor of the fourth intrinsic amorphous silicon layer is 0.5, and the thickness of the fourth intrinsic amorphous silicon layer is 1.5 nm.

The structural factor of the fifth intrinsic amorphous silicon layer is 0.35, and the thickness of the fifth intrinsic amorphous silicon layer is 5.5 nm.

The silicon-oxygen ratio of the first oxygen-containing seed layer is 0.15, the phosphorus-silicon ratio of the first oxygen-containing seed layer is 0.03, the crystallization rate of the first oxygen-containing seed layer is 60%, and the thickness of the first oxygen-containing seed layer is 1 nm.

The silicon-oxygen ratio of the second oxygen-containing seed layer is 0.45, the phosphorus-silicon ratio of the second oxygen-containing seed layer is 0.1, the crystallization rate of the second oxygen-containing seed layer is 55%, and the thickness of the second oxygen-containing seed layer is 1 nm.

The silicon-oxygen ratio of the N-type doped host layer is 0.75, the phosphorus-silicon ratio of the N-type doped host layer is 0.75, the crystallization rate of the N-type doped host layer is 45%, and the thickness of the N-type doped host layer is 15 nm.

The phosphorus-silicon ratio of the N-type doped contact layer is 0.85, the crystallization rate of the N-type doped contact layer is 35%, and the thickness of the N-type doped contact layer is 2 nm.

The boron-silicon ratio of the P-type doped seed layer is 0.03, the crystallization rate of the P-type doped seed layer is 60%, and the thickness of the P-type doped seed layer is 2 nm.

The boron-silicon ratio of the P-type doped host layer is 0.08, the crystallization rate of the P-type doped host layer is 55%, and the thickness of the P-type doped host layer is 26 nm.

The boron-silicon ratio of the P-type doped contact layer is 0.2, the crystallization rate of the P-type doped contact layer is 35%, and the thickness of the P-type doped contact layer is 3 nm.

Step S520 includes: the first sub-passivation layer is formed on the front side of the silicon substrate by hydrogen, silane, and carbon dioxide gases, with the PECVD apparatus; the carbon-doped amorphous silicon layer is formed on the first sub-passivation layer by increasing the hydrogen/silane ratio, introducing methane gas and ceasing the introduction of carbon dioxide gas, with the PECVD apparatus; the second sub-passivation layer is formed on the carbon-doped amorphous silicon layer by further increasing the hydrogen/silane ratio, and ceasing the introduction of methane gas, with the PECVD apparatus; where, the first sub-passivation layer, carbon-doped amorphous silicon layer, and the second sub-passivation layer jointly constitute the first passivation layer.

Embodiment 10

Referring to FIG. 4, this embodiment provides a silicon-based heterojunction solar cell and a manufacturing method thereof, which are essential the same as those of embodiment 6, the differences are as follows.

A pre-passivation layer 250 is arranged between the silicon substrate 100 and the first sub-passivation layer 211.

The method for manufacturing the silicon-based heterojunction solar cell of Embodiment 10, between Steps S510 and S520, further includes: Step S580: a pre-passivation layer 250 is formed on the front side of the silicon substrate 100.

Step S520 includes: the first sub-passivation layer 211 is formed on the pre-passivation layer 250 by hydrogen and silane, with the PECVD apparatus;

Step S580, the formation of the pre-passivation layer 250 on the front side of the silicon substrate 100 includes:
Step S581: a silicon oxide protective layer is formed on the front side and the back side of the silicon substrate 100 by the slow-lifting process in hot water.
Step S582: the silicon oxide protective layer on the back side of the silicon substrate 100 is removed by the first plasma-etching process; where the first plasma-etching process is a hydrogen plasma-etching process with a radio frequency power of 400 W and an etching time of 10 s.
Step S583: the silicon oxide protective layer on the front side of the silicon substrate 100 is treated by the second plasma-etching process to remove physically adsorbed impurities, and the silicon oxide protective layer on the front side of the silicon substrate 100 is transformed into a pre-passivation layer 250; where the second plasma-etching process is a hydrogen plasma-etching process with a radio frequency power of 350 W and an etching time of 5 s.

In order to illustrate the technical effects of the embodiments of the present application more clearly, Comparative Embodiment 1 is provided in the present application.

Comparative Embodiment 1

This comparative embodiment provides a silicon-based heterojunction solar cell and a manufacturing method thereof, which are essential the same as those of embodiment 1, the differences are as follows.

Step S420 includes: an intrinsic amorphous silicon layer is formed on the front side of the silicon substrate by hydrogen and silane, with the PECVD apparatus; where, the intrinsic amorphous silicon layer is taken as the first passivation layer.

Step S460 includes: ITO is deposited on the N-type doped layer to form the first transparent conductive oxide layer, with the PVD method; and ITO is deposited on the P-type doped layer to form the second transparent conductive oxide layer, with the PVD method.

In Comparative Embodiment 1, the silicon-based heterojunction solar cell includes: along the first direction, the intrinsic amorphous silicon layer, the N-type doped layer, the first transparent conductive oxide layer, and the first electrode are sequentially stacked on the front side of the silicon substrate; where, the intrinsic amorphous silicon layer is taken as the first passivation layer, the structural factor of the intrinsic amorphous silicon layer is 0.5, and the thickness of the intrinsic amorphous silicon layer is 10 nm.

In order to carry out stability test, the above silicon-based heterojunction solar cells are packaged. The performance characterization of the silicon-based heterojunction solar cells of Embodiments 1 to 10 and Comparative Embodiment 1 of the present application were tested, to obtain short-circuit current density Jsc, open-circuit voltage Voc, fill factor FF, and photoelectric conversion efficiency PCE of the corresponding cell devices. The test results thereof are shown in table 1.

TABLE 1

|  | Voc(V) | Jsc(mA/cm$^2$) | FF(%) | PCE(%) |
| --- | --- | --- | --- | --- |
| Embodiment 1 | 748 | 39.5 | 84.8 | 25.06 |
| Embodiment 2 | 746 | 39.3 | 84.6 | 24.80 |
| Embodiment 3 | 751 | 39.5 | 85.2 | 25.27 |
| Embodiment 4 | 747 | 39.4 | 85.1 | 25.04 |
| Embodiment 5 | 750 | 40.2 | 85.1 | 25.66 |
| Embodiment 6 | 749 | 40.3 | 85.5 | 25.81 |
| Embodiment 7 | 751 | 40.1 | 85.3 | 25.69 |
| Embodiment 8 | 752 | 40.1 | 85.2 | 25.69 |
| Embodiment 9 | 749.5 | 40.3 | 85.6 | 25.86 |
| Embodiment 10 | 751 | 40.7 | 85.9 | 26.26 |
| Comparative Embodiment 1 | 735 | 39.0 | 84.1 | 24.11 |

As can be seen from the data in table 1, compared with Comparative Embodiment 1, the open-circuit voltage and the short-circuit current density of the corresponding cell devices of the silicon-based heterojunction solar cells of Embodiments 1 to 10 are slightly increased, and the fill factor and the photoelectric conversion efficiency are significantly improved. In embodiments 1 to 10 of the present application, the first passivation layer includes the first sub-passivation layer, the carbon-doped amorphous silicon layer, and the second sub-passivation layer which are sequentially stacked. It shows that the first passivation layer possesses the excellent passivation effect and a wider band-gap, which can reduce the thickness of the first passivation layer, and improve the short-circuit current and the fill factor of the silicon-based heterojunction solar cell, thereby improving the device performance.

In summary, the first passivation layer of any one embodiment of the present application includes a first sub-passivation layer, a carbon-doped amorphous silicon layer, and a second sub-passivation layer which are sequentially stacked. The first sub-passivation layer, which is close to the silicon substrate, possesses the excellent passivation effect; and the second sub-passivation layer, which is far away from the silicon substrate, is conducive to the formation of the subsequent doped layer. The carbon-doped amorphous silicon layer, located between the first sub-passivation layer and the second sub-passivation layer, is an amorphous structure formed by silicon carbide ($Si_xC_y$, x is not equal to y), which is beneficial to optimize the conductivity of the film layer, thereby reducing the thickness of the first passivation layer, and avoiding the issues such as the increase of resistance and the decrease of fill factor caused by excessively thick intrinsic amorphous silicon layer. In addition, the silicon carbide has a wider bandgap between the valence band and the conduction band, and the bandgap is 2.8-4.2 eV, which can improve the short-circuit current and fill factor of silicon-based heterojunction solar cells, thereby enhancing the performance of the device.

It should be noted that terms such as "length," "width," "thickness," "top," "bottom," "front," "back," "left," "right," "vertical," "horizontal," "top," "bottom," "inner," and "outer" are used solely for the purpose of facilitating the description of this present application and simplifying the description. They do not indicate or imply that the corresponding devices or components must have specific orientations, construction and operation in specific directions, and should not be construed as limiting the scope of this present application. The terms "inner" and "outer" refer to the inside and outside relative to the outline of the components themselves. For instance, if the device shown in the drawings is inverted, the device described as "above" or "on top of" other devices or structures will subsequently be positioned "below" or "underneath" those devices or structures. Therefore, the exemplary term "above . . . " can mean both of "above . . . " and "below . . . ". The device can also be positioned in other ways (rotated 90 degrees or in other orientations), and the relatively spatial descriptions should be correspondingly interpreted in the present application.

It should be understood that the terms "first," "second," etc., in the specification, claims, and the above drawings of this present application, are to distinguish similar objects and do not necessarily describe a specific order or sequence. It should be understood that such terms are interchangeable, so that the embodiments described can be implemented in an order other than that illustrated or described here. Furthermore, the terms "comprise", "include" and other similar terms are intended to cover non-exclusive inclusions. That is, a process, a method, a system, a product, or a device that includes a series of steps or units does not only necessarily limit those steps or units as clearly listed, but may also include other steps or units that are not clearly listed or are inherent to these processes, methods, products, or devices.

It should also be noted that, in this present application, the terms "one embodiment," "another embodiment," "embodiment," etc. refer to specific features, structures, or characteristics described in conjunction with at least one embodiment summarized in this present application. The same expression in multiple places of the specification does not necessarily refer to the same embodiment. Furthermore, when a specific feature, a specific structure, or a specific characteristic is described in conjunction with any embodiment, the assertion is that combining this feature, structure, or characteristic with other embodiments also falls within the scope of this present application.

In the above embodiments, each embodiment is described with its own emphasis, and parts not detailed in one embodiment can refer to the relevant descriptions in other embodiments.

It should also be noted that the above embodiments are merely intended to explain the technical solutions of the present application, rather than to limit the present application. Any equivalent structures or equivalent processes that are adapted from the content of this present application's specification and drawings recorded therein, directly or indirectly applied in other related technical fields, is without deviating the essence of the corresponding technical solutions from the scope of the technical solutions of the embodiments of the present application.

The invention claimed is:

1. A silicon-based heterojunction solar cell, comprising:
a silicon substrate comprising a front side and a back side, the front side being arranged opposite to the back side;
a first passivation layer, an N-type doped layer, a first transparent conductive oxide layer and a first electrode, which are sequentially stacked on the front side of the silicon substrate along a first direction; wherein
the first passivation layer comprises a first sub-passivation layer, a carbon-doped amorphous silicon layer, and a second sub-passivation layer which are sequentially stacked along the first direction; and
the carbon-doped amorphous silicon layer is arranged between the first sub-passivation layer and the second sub-passivation layer, which is beneficial for an electronic band transition based on a defect density of carbon-doped amorphous silicon, thereby improving a conductivity of the first passivation layer;
wherein a structural factor of the first sub-passivation layer is 0.6-0.75, a structural factor of the carbon-doped amorphous silicon layer is 0.45-0.58, and a structural factor of the second sub-passivation layer is 0.3-0.43.

2. The silicon-based heterojunction solar cell according to claim 1, wherein a carbon content of the carbon-doped amorphous silicon layer is 0.1-4.4 at %.

3. The silicon-based heterojunction solar cell according to claim 1, wherein a thickness ratio of the carbon-doped amorphous silicon layer to the first sub-passivation layer is 1-4:1, and a thickness ratio of the second sub-passivation layer to the first sub-passivation layer is 5-7:1.

4. The silicon-based heterojunction solar cell according to claim 1, wherein the first sub-passivation layer is a first oxygen-doped amorphous silicon layer or a first intrinsic amorphous silicon layer, and a silicon-oxygen ratio of the first oxygen-doped amorphous silicon layer is greater than 0.1 and less than 1; and/or
the second sub-passivation layer is a second oxygen-doped amorphous silicon layer or a second intrinsic amorphous silicon layer, and a silicon-oxygen ratio of the second oxygen-doped amorphous silicon layer is greater than 0.1 and less than 1.

5. The silicon-based heterojunction solar cell according to claim 1, further comprising:
a pre-passivation layer being arranged between the silicon substrate and the first passivation layer;
wherein a material of the pre-passivation layer comprises silicon oxide;
the pre-passivation layer is formed by successively employing a slow-lifting process in hot water and a plasma-etching process.

6. The silicon-based heterojunction solar cell according to claim 1, wherein the N-type doped layer comprises a first oxygen-containing seed layer, a second oxygen-containing seed layer, an N-type doped host layer, and an N-type doped contact layer which are sequentially stacked along the first direction; wherein
a silicon-oxygen ratio of the first oxygen-containing seed layer is greater than or equal to 0.05 and less than 0.4, a silicon-oxygen ratio of the second oxygen-containing seed layer is greater than or equal to 0.4 and less than 0.7, and a silicon-oxygen ratio of the N-type doped host layer is greater than or equal to 0.6 and less than 1; and/or
a phosphorus-silicon ratio of the first oxygen-containing seed layer is greater than or equal to 0.01 and less than 0.05, a phosphorus-silicon ratio of the second oxygen-containing seed layer is greater than or equal to 0.05 and less than 0.3, a phosphorus-silicon ratio of the N-type doped host layer is greater than or equal to 0.06 and less than 1, and a phosphorus-silicon ratio of the N-type doped contact layer is greater than or equal to 0.06 and less than 1.

7. The silicon-based heterojunction solar cell according to claim 6, wherein a crystallization rate of the first oxygen-containing seed layer is 52%-70%; a crystallization rate of the second oxygen-containing seed layer is 50.5%-68%; a crystallization rate of the N-type doped host layer is greater than 10% and less than 50%, and a crystallization rate of the N-type doped contact layer is greater than 0% and less than 50%; wherein the crystallization rate of the second oxygen-containing seed layer is less than the crystallization rate of the first oxygen-containing seed layer.

8. The silicon-based heterojunction solar cell according to claim 6, wherein the silicon-oxygen ratio of the first oxygen-containing seed layer, the silicon-oxygen ratio of the second oxygen-containing seed layer, and the silicon-oxygen ratio of the N-type doped host layer increase sequentially.

9. The silicon-based heterojunction solar cell according to claim 6, wherein the silicon-oxygen ratio of the first oxygen-containing seed layer is 0.1-0.35, the silicon-oxygen ratio of the second oxygen-containing seed layer is 0.4-0.58, and the silicon-oxygen ratio of the N-type doped host layer is 0.6-0.95.

10. The silicon-based heterojunction solar cell according to claim 6, wherein the phosphorus-silicon ratio of the first oxygen-containing seed layer, the phosphorus-silicon ratio of the second oxygen-containing seed layer, the phosphorus-silicon ratio of the N-type doped host layer, and the phosphorus-silicon ratio of the N-type doped contact layer increase sequentially.

11. The silicon-based heterojunction solar cell according to claim 6, wherein the phosphorus-silicon ratio of the first oxygen-containing seed layer is 0.01-0.045, the phosphorus-silicon ratio of the second oxygen-containing seed layer is 0.05-0.25, the phosphorus-silicon ratio of the N-type doped host layer is 0.06-0.98, and the phosphorus-silicon ratio of the N-type doped contact layer is 0.06-0.98.

12. The silicon-based heterojunction solar cell according to claim 1, further comprising:
a second passivation layer, a P-type doped layer, a second transparent conductive oxide layer, and a second electrode, which, along a second direction, are sequentially stacked on the back side of the silicon substrate;
wherein the P-type doped layer comprises a P-type doped seed layer, a P-type doped host layer, and a P-type doped contact layer which are sequentially stacked along the second direction;
the second direction is opposite to the first direction;
a boron-silicon ratio of the P-type doped seed layer is greater than 0.01 and less than 0.9, a boron-silicon ratio of the P-type doped host layer is greater than 0.04 and less than 0.95, a boron-silicon ratio of the P-type doped contact layer is greater than 0.06 and less than 1, and the boron-silicon ratio of the P-type doped seed layer is less than the boron-silicon ratio of the P-type doped host layer; and/or
a crystallization rate of the P-type doped seed layer is greater than 50% and less than 70%, a crystallization rate of the P-type doped host layer is greater than 25% and less than 60%, a crystallization rate of the P-type doped contact layer is greater than 20% and less than 50%, and the crystallization rate of the P-type doped seed layer is greater than the crystallization rate of the P-type doped host layer.

13. The silicon-based heterojunction solar cell according to claim 12, wherein the second passivation layer comprises a third intrinsic amorphous silicon layer, a fourth intrinsic amorphous silicon layer, and a fifth intrinsic amorphous silicon layer which are sequentially stacked along the second direction;
wherein a structural factor of the third intrinsic amorphous silicon layer is greater than a structural factor of the fourth intrinsic amorphous silicon layer, and the structural factor of the fourth intrinsic amorphous silicon layer is greater than a structural factor of the fifth intrinsic amorphous silicon layer.

14. The silicon-based heterojunction solar cell according to claim 13, wherein the structural factor of the third intrinsic amorphous silicon layer is 0.5-0.7; the structural factor of the fourth intrinsic amorphous silicon layer is 0.4-0.6; the structural factor of the fifth intrinsic amorphous silicon layer is 0.2-0.4.

15. A method for manufacturing a silicon-based heterojunction solar cell according to claim 1, comprising:
providing a silicon substrate, wherein the silicon substrate comprises a front side and a back side, and the front side is arranged opposite to the back side;
sequentially forming, on the front side of the silicon substrate, a first sub-passivation layer, a carbon-doped amorphous silicon layer, and a second sub-passivation layer; wherein the first sub-passivation layer, the carbon-doped amorphous silicon layer, and the second sub-passivation layer jointly constitute a first passivation layer;
forming an N-type doped layer on the second sub-passivation layer;
forming a first transparent conductive oxide layer on the N-type doped layer;
forming a first electrode on the first transparent conductive oxide layer.

16. The method for manufacturing a silicon-based heterojunction solar cell according to claim 15, before forming the first sub-passivation layer, further comprising:
forming a pre-passivation layer on the front side of the silicon substrate by successively employing a slow-lifting process in hot water and a plasma-etching process;
wherein a material of the pre-passivation layer comprises silicon oxide.

17. The method for manufacturing a silicon-based heterojunction solar cell according to claim 16, wherein, forming a pre-passivation layer comprises:
forming a silicon oxide protective layer on the front side and the back side of the silicon substrate by the slow-lifting process in hot water;
removing a silicon oxide protective layer on the back of the silicon substrate by a first plasma-etching process;
treating a silicon oxide protection layer on the front side of the silicon substrate by a second plasma-etching process, to remove physical adsorption impurities and transform the silicon oxide protection layer on the front side of the silicon substrate into the pre-passivation layer.

18. The method for manufacturing a silicon-based heterojunction solar cell according to claim 15, further comprising:
forming a second passivation layer on the back side of the silicon substrate;

sequentially forming, on the second passivation layer, a P-type doped seed layer, a P-type doped host layer and a P-type doped contact layer; wherein the P-type doped seed layer, the P-type doped host layer and the P-type doped contact layer jointly constitute a P-type doped layer;

forming a second transparent conductive oxide layer on the P-type doped contact layer, forming a second electrode on the second transparent conductive oxide layer.

\* \* \* \* \*